(12) United States Patent
Hsieh

(10) Patent No.: US 7,589,351 B2
(45) Date of Patent: Sep. 15, 2009

(54) LIGHT-EMITTING DEVICE

(75) Inventor: Min-Hsun Hsieh, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 294 days.

(21) Appl. No.: 11/798,803

(22) Filed: May 17, 2007

(65) Prior Publication Data

US 2007/0267650 A1 Nov. 22, 2007

(30) Foreign Application Priority Data

May 17, 2006 (TW) .............................. 95117591 A

(51) Int. Cl.
*H01L 33/00* (2006.01)
(52) U.S. Cl. .............................. 257/79; 257/98; 257/99; 257/100; 257/E33.57; 257/E33.67; 257/E33.68; 257/E33.72
(58) Field of Classification Search ................... 257/79, 257/98–100
See application file for complete search history.

(56) References Cited

U.S. PATENT DOCUMENTS

| 6,647,050 | B2 | 11/2003 | Yuen et al. | |
|---|---|---|---|---|
| 6,969,874 | B1 | 11/2005 | Gee et al. | |
| 2003/0010986 | A1* | 1/2003 | Lin et al. | ....................... 257/79 |
| 2006/0006524 | A1 | 1/2006 | Hsieh | |
| 2006/0208364 | A1* | 9/2006 | Wang et al. | .................. 257/778 |

FOREIGN PATENT DOCUMENTS

| JP | 2006-245156 | 9/2006 |
|---|---|---|
| TW | 465123 | 11/2001 |
| TW | 543128 | 7/2003 |
| TW | 548857 | 8/2003 |

* cited by examiner

*Primary Examiner*—A. Sefer
(74) *Attorney, Agent, or Firm*—Bacon & Thomas, PLLC

(57) ABSTRACT

A light-emitting device comprises a carrier, an insulated transparent adhesive layer, and a multi-layer epitaxial light-emitting structure located on the upper side of the insulated transparent adhesive layer. The top surface of the carrier comprises a first contact pad and a second contact pad. The insulated transparent adhesive layer is located on the upper side of the carrier, the first contact pad, and the second contact pad. The multi-layer epitaxial light-emitting structure comprises an active layer, a transparent layer located on the multi-layer epitaxial light-emitting structure, a third contact pad, and a fourth contact pad located on the multi-layer epitaxial light-emitting structure. At least one of surfaces of the first contact pad and the third contact pad facing the insulated transparent adhesive layer has a first plurality of protrusions. The first plurality of protrusions pierces the insulated transparent adhesive layer to electrically connect the first contact pad to the third contact pad. At least one of surfaces of the second contact pad and the fourth contact pad facing the insulated transparent adhesive layer has a second plurality of protrusions. The second plurality of protrusions pierces the insulated transparent adhesive layer to electrically connect the second contact pad to the fourth contact pad.

17 Claims, 4 Drawing Sheets

LIGHT-EMITTING DEVICE

REFERENCE TO RELATED APPLICATION

The present application claims the right of priority based on Taiwan Application Serial Number 095117591, filed on May 17, 2006, the disclosure of which incorporated herein by reference in its entirety.

TECHNICAL FIELD

The present invention relates to a light-emitting device, and more particularly, to a light-emitting device with improved light extraction efficiency.

BACKGROUND

The light-emitting mechanism and the structure of a light-emitting diode (LED) are different from that of the conventional light source. The LED owns the advantages of small size and high reliability, and is applicable diversely in the market. For example, LED can be produced as all kinds of large-sized devices for indoor or large outdoor displays in compliance with different needs.

Taking the blue LED chip of GaN series as example, because the sapphire substrate is an insulating substrate, the p type electrode and the n type electrode of the blue LED chip are located on the same side of the blue LED chip. When being encapsulated, the blue LED chip is mounted on a carrier in a manner of the electrodes of the blue LED chip facing upward and the sapphire substrate facing the carrier. The bond pads are formed on the p type and the n type electrodes respectively. The p type and the n type electrodes electrically connect to the carrier through golden wires in a wiring manner respectively. Finally, the blue LED chip is encapsulated by transparent encapsulating materials. Because it takes spaces to accommodate the golden wires the size of the encapsulated LED is larger, and makes it not applicable to the applications with size restriction like back light module.

To reduce the size of the LED, solder bumps are developed on the electrodes of the LED chip, and melted to become a golden ball after reflow. The chip is then reversely mounted on the carrier in a manner of the electrodes facing the carrier. The pads of the carrier are mounted with the two electrodes to form a flip chip structure with electrical connection. However, when the metal is melted to form the solder bump, it spreads to other areas of the chip or the carrier and makes the device short. Furthermore, the manufacturing process is complicated and the cost is high.

In addition, the metals with lower melting point, such as PdSn layer, can replace the solder bumps. With ultrasonically heating technology for bonding, the eutectic reaction is formed between the pads of the PdSn layer and the carrier to mount the chip and the carrier for electrical connection. However, this method needs better flatness of the surfaces of the bond pad and the carrier. If the surfaces are rough, the problems of chip peeling and insufficient mounting force usually occur after mounting.

Another bonding technology is using opaque anisotropic conductive film as an adhesive between the chip and the carrier. In general, the anisotropic conductive film has the conductive particles spread in the epoxy. When the chip is mounted on the carrier through heating and pressurization, the conductive particles can contact the chip and the carrier to generate electrical connection. Because the anisotropic conductive film is opaque, light emitting from the chip to the carrier is absorbed. Thus, a reflecting apparatus should be provided between the chip and the anisotropic conductive film to reflect the light emitted to the reflecting apparatus to the upper side of the chip. However, because of the internal total reflection, a portion of the light is reflected to inside of the LED and the possibility of absorption by the active layer is increased. Consequently, the brightness and the efficiency are reduced.

Therefore, it is necessary to provide a light-emitting device with stronger mounting force between the chip and the carrier and improving brightness and the light-emitting efficiency, for settling the problems in the known technology.

SUMMARY OF THE INVENTION

The present invention is a light-emitting device comprising a carrier, a multi-layer epitaxial layer with a light-pervious layer, and an insulated transparent adhesive layer improving the mounting force between the carrier and the multi-layer epitaxial layer.

In one embodiment of the present invention is to provide a light-emitting device comprising a carrier, an insulated transparent adhesive layer, and a multi-layer epitaxial light-emitting structure located on the upper side of the insulated transparent adhesive layer. The top surface of the carrier comprises a first contact pad and a second contact pad. The insulated transparent adhesive layer is located on the upper side of the carrier, the first contact pad, and the second contact pad. The multi-layer epitaxial light-emitting structure comprises an active layer, a light-pervious layer located on the upper side of the multi-layer epitaxial light-emitting structure, a third contact pad, and a fourth contact pad located on the bottom surface of the multi-layer epitaxial light-emitting structure. At least one of the surfaces of the first contact pad and the third contact pad facing the insulated transparent adhesive layer has a first plurality of protrusions. The first plurality of protrusions pierces the insulated transparent adhesive layer to electrically connect the first contact pad to the third contact pad. At least one of the surfaces of the second contact pad and the fourth contact pad facing the insulated transparent adhesive layer has a second plurality of protrusions. The second plurality of protrusions pierces the insulated transparent adhesive layer to electrically connect the second contact pad to the fourth contact pad.

The present invention also provides a light-emitting device with an insulated transparent adhesive layer comprising a light-pervious carrier and a multi-layer epitaxial layer with a light-pervious layer. The insulated transparent adhesive layer attaches the light-pervious carrier to the multi-layer epitaxial layer to prevent the light entering the light-pervious carrier from being reflected to the multi-layer epitaxial layer and absorbed. Consequently, the brightness and the light-emitting efficiency of the light-emitting device are improved.

In another embodiment, the present invention provides a light-emitting device comprising a light-pervious carrier, an insulated transparent adhesive layer, and a multi-layer epitaxial light-emitting structure located on the upper side of the insulated transparent adhesive layer. The top surface of the carrier comprises a first contact pad and a second contact pad. The insulated transparent adhesive layer is located on the upper side of the carrier, the first contact pad, and the second contact pad. The multi-layer epitaxial light-emitting structure comprises an active layer, a light-pervious layer located on the upper side of the multi-layer epitaxial light-emitting structure, a third contact pad, and a fourth contact pad located on the bottom surface of the multi-layer epitaxial light-emitting structure. At least one of the surfaces of the first contact pad and the third contact pad facing the insulated transparent adhesive layer has a first plurality of protrusions. The first plurality of protrusions pierces the insulated transparent adhesive layer to electrically connect the first contact pad to the third contact pad. At least one of the surfaces of the second contact pad and the fourth contact pad facing the insulated transparent adhesive layer has a second plurality of protrusions. The second plurality of protrusions pierces the insulated transparent adhesive layer to electrically connect the second contact pad to the fourth contact pad.

DETAILED DESCRIPTION OF THE PREFERRED EMBODIMENTS

Figure 1A:
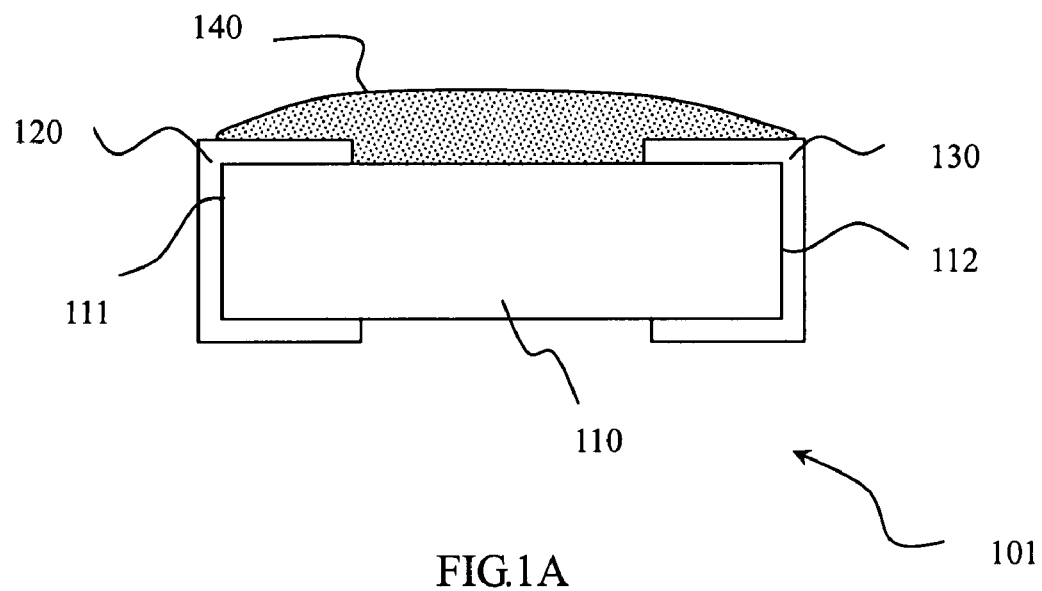
FIGS. 1A~1C show a schematic diagram of one embodiment of the light-emitting device in the present invention.
Figure 1B:
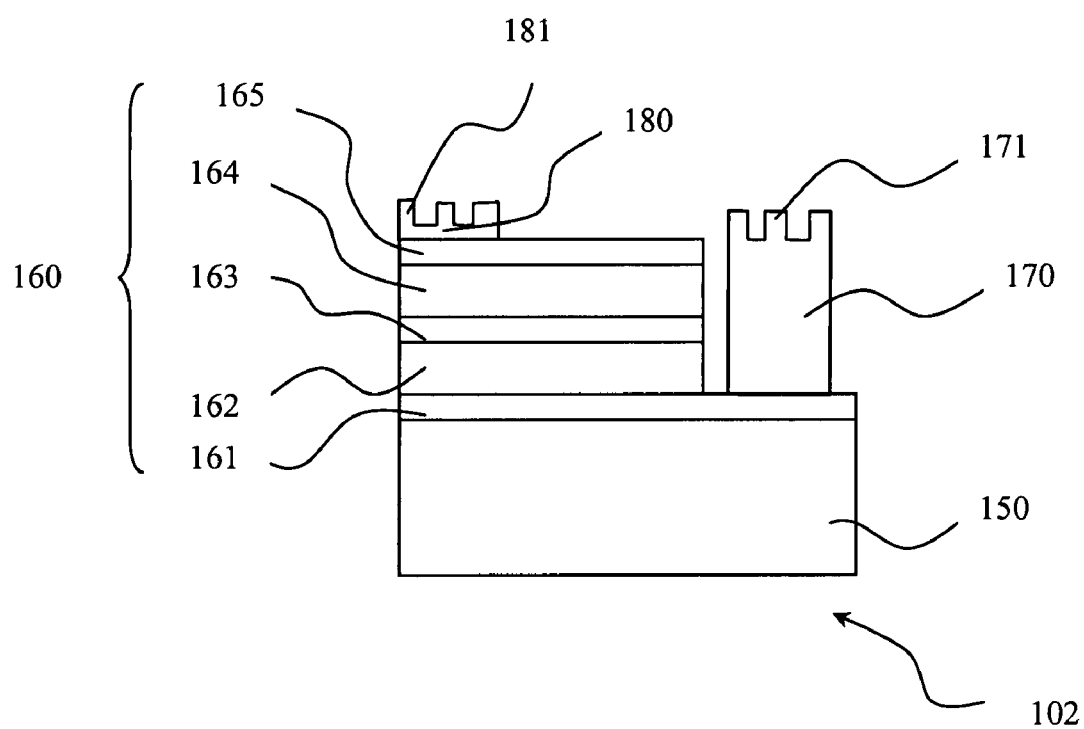
Figure 1C:
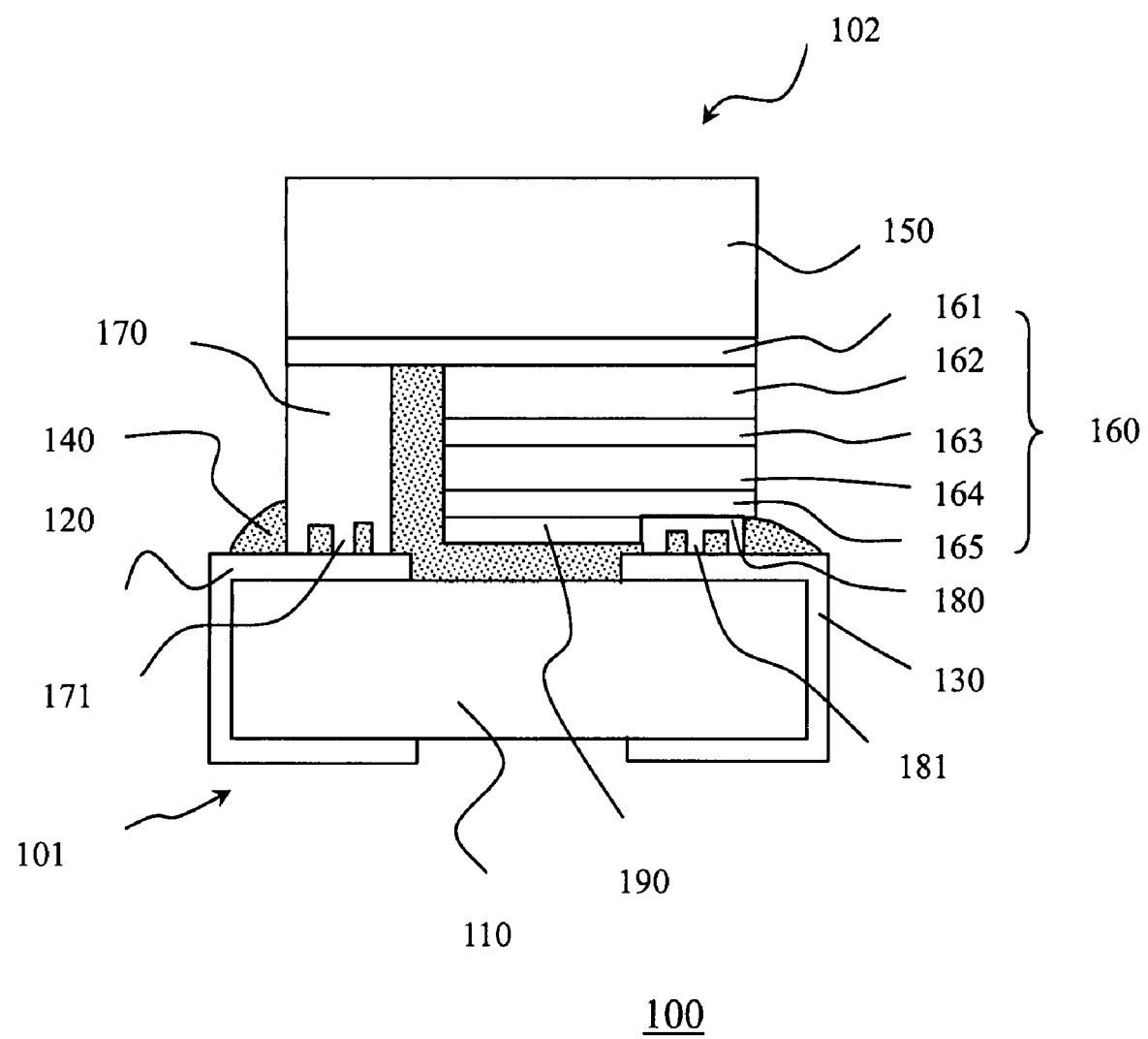

In FIGS. 1A~1C, a loading device 101 of the light-emitting device 100 comprises a carrier 110, a first contact pad 120, a second contact pad 130, and an insulated transparent adhesive layer 140. The first contact pad 120, extending from the top surface to the bottom surface along a first lateral surface 111 of the carrier 110, covers a portion of the carrier 110. The second contact pad 130, extending from the top surface to the bottom surface along a second lateral surface 112 of the carrier 110, covers a portion of the carrier 110. The insulated transparent adhesive layer 140 is located on the upper side of the carrier 110, the first contact pad 120, and the second contact pad 130. The material of the carrier 110 comprises but is unrestricted to Printed Circuit Board (PCB). The material of the insulated transparent adhesive layer 140 comprises but is unrestricted to spin-on glass, silicone, BCB, epoxy, polyimide, or PFCB. The materials of the first contact pad 120 and the second contact pad 130 comprise conductive metals, such as Ni, Au, Al, Pt, Cr, or Ti, but are insulated electrically to each other.

In FIG. 1B, a chip 102 of the light-emitting device 100 comprises a light-pervious layer 150, a multi-layer epitaxial light-emitting structure 160, a third contact pad 170, and a fourth contact pad 180. The multi-layer epitaxial light-emitting structure 160 is located on the upper side of the light-pervious layer 150. The multi-layer epitaxial light-emitting structure 160 comprises a first contact layer 161, a first cladding layer 162, a active layer 163, a second cladding layer 164, and a second contact layer 165. After being etched partially, a portion of the first contact layer 161 is exposed. The third contact pad 170 is formed on the exposed portion of the first contact layer 161. The fourth contact pad 180 is located on the second contact layer 165. The light-pervious layer 150 can be an epitaxial grown semiconductor light-pervious window layer or a transparent substrate. The material of the light-pervious layer 150 comprises but is unrestricted to glass, sapphire, SiC, GaP, GaSaP, or ZnSe. The materials of the first contact 161 and the second contact layer 165 comprise III-V semiconductor materials, such as GaP, GaAs, GaAsP, GaN, GaInN, AlGaInN, AlGaN, or other well-known three elements or four elements III-V semiconductor materials. The materials of the first cladding layer 162, the active layer 163, and the second cladding layer 164 comprise three elements or four elements II-V semiconductor materials of AlGaInP and AlGaInN. The materials of the third contact pad 170 and the fourth contact pad 180 comprise but are unrestricted to Au, Al, Pt, Cr, or Ti. A first plurality of protrusions 171 is formed on the surface of the third contact pad 170. A second plurality of protrusions 181 is formed on the surface of the fourth contact pad 180. There are a lot of methods to form the first plurality of protrusions and the second plurality of protrusions. For example, the surfaces of the third contact pad 170 and the fourth contact pad 180 can be etched respectively by lithography to form a plurality of recess regions, and have a plurality of protruding regions formed on the unetched portion. In addition, a conductive contact layer can be formed on the surfaces of the third contact pad 170 and the fourth contact pad 180 respectively. A portion of the conductive contact layer can be removed by lithography to form a plurality of protruding regions disseminated on the surfaces of the third contact pad 170 and the fourth contact pad 180.

In FIGS. 1A~1C, the chip 102 is mounted reversely on the carrier 101. The insulated transparent adhesive layer 140 adheres the chip 102 to the carrier 101. The first plurality of protrusions 171 pierces the insulated transparent adhesive layer 140 to electrically connect the first contact pad 120. The second plurality of protrusions 181 pierces the insulated transparent adhesive layer 140 to electrically connect the second contact pad 130 as well.

In addition, the light-emitting device 100 can have an additional reflecting body 190 on the surface of the multi-layer epitaxial light-emitting structure 160 facing the carrier 110. For example, the reflecting body 190 is attached directly to the surface of the multi-layer epitaxial light-emitting structure 160. The material of the reflecting body 190 comprises Sn, Al, Au, Pt, An, Ge, or Ag. The reflecting body 190 can also be a Distributed Bragg Reflector (DBR) composed of oxide, which is $Al_2O_3$, $SiO_2$, or $TiO_2$.

Figure 2A:
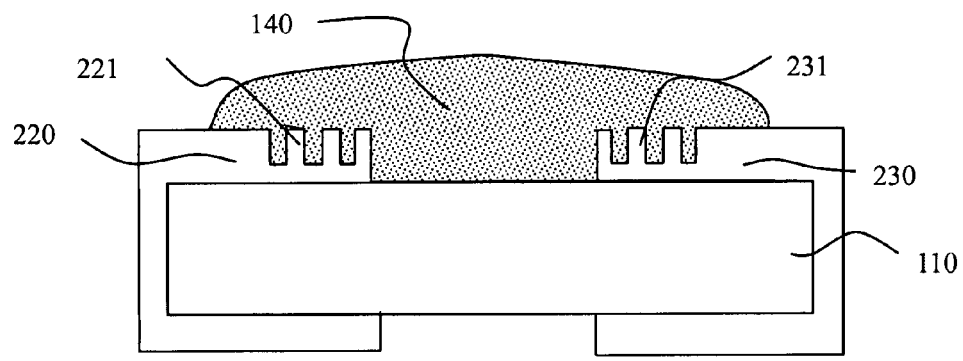
FIGS. 2A~2B show a schematic diagram of another embodiment of the light-emitting device in the present invention.
Figure 2B:
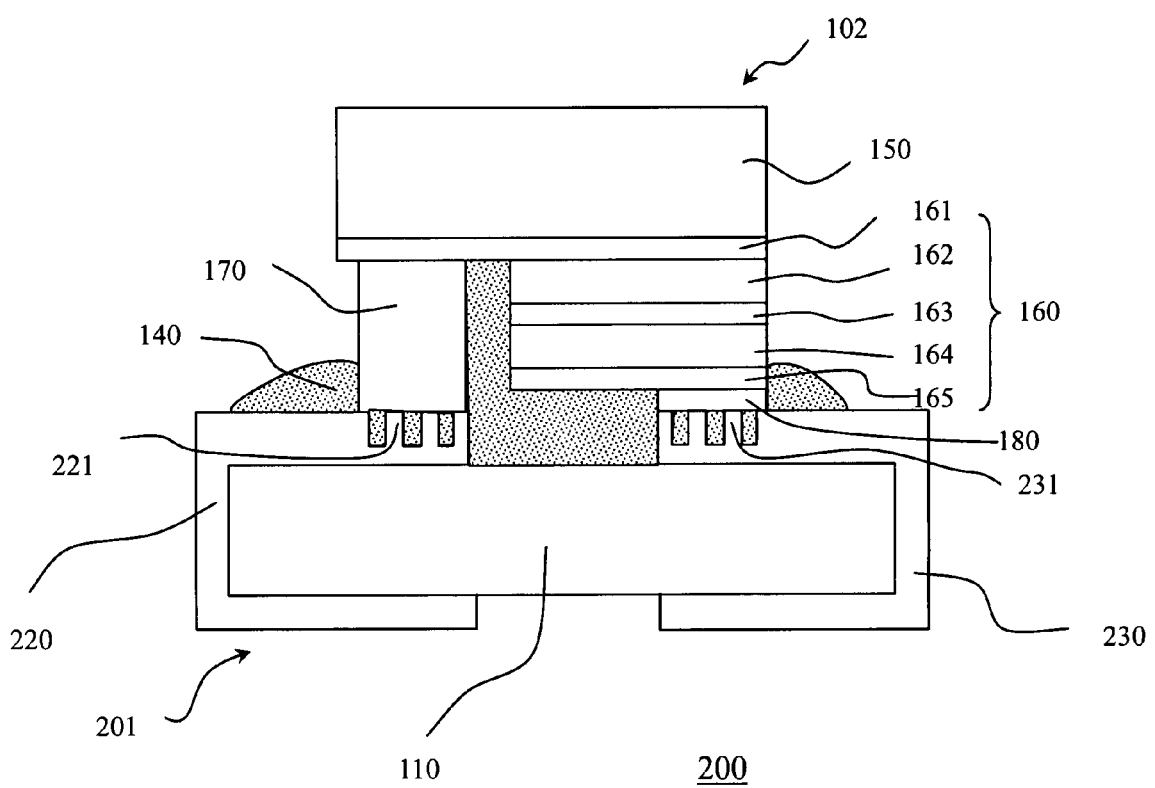

In FIGS. 2A~2B, the structure of a light-emitting device 200 is similar to that of the light-emitting device 100 mentioned above. The difference between them is that the surfaces of the third contact pad 170 and the fourth contact pad 180 of the light-emitting device 200 are flat. The surface of the first contact pad 220 has a first plurality of protrusions 221, and the surface of the second contact pad 230 has a second plurality of protrusions 231. The first plurality of protrusions 221 pierces the insulated transparent adhesive layer 140 to electrically connect the third contact pad 170. The second plurality of protrusions 181 pierces the insulated transparent adhesive layer 140 to electrically connect the fourth contact pad 130 as well.

In addition, the surfaces of the third contact pad 170, the fourth contact pad 180, the first contact pad 120, and the second contact pad 130 the light-emitting device can also respectively have a plurality of protrusions piercing the insulated transparent adhesive layer 140 respectively. Thus, the third contact pad 170 electrically connects the first contact pad 120, and the fourth contact pad 180 electrically connects the second contact pad 130.

Figure 3:
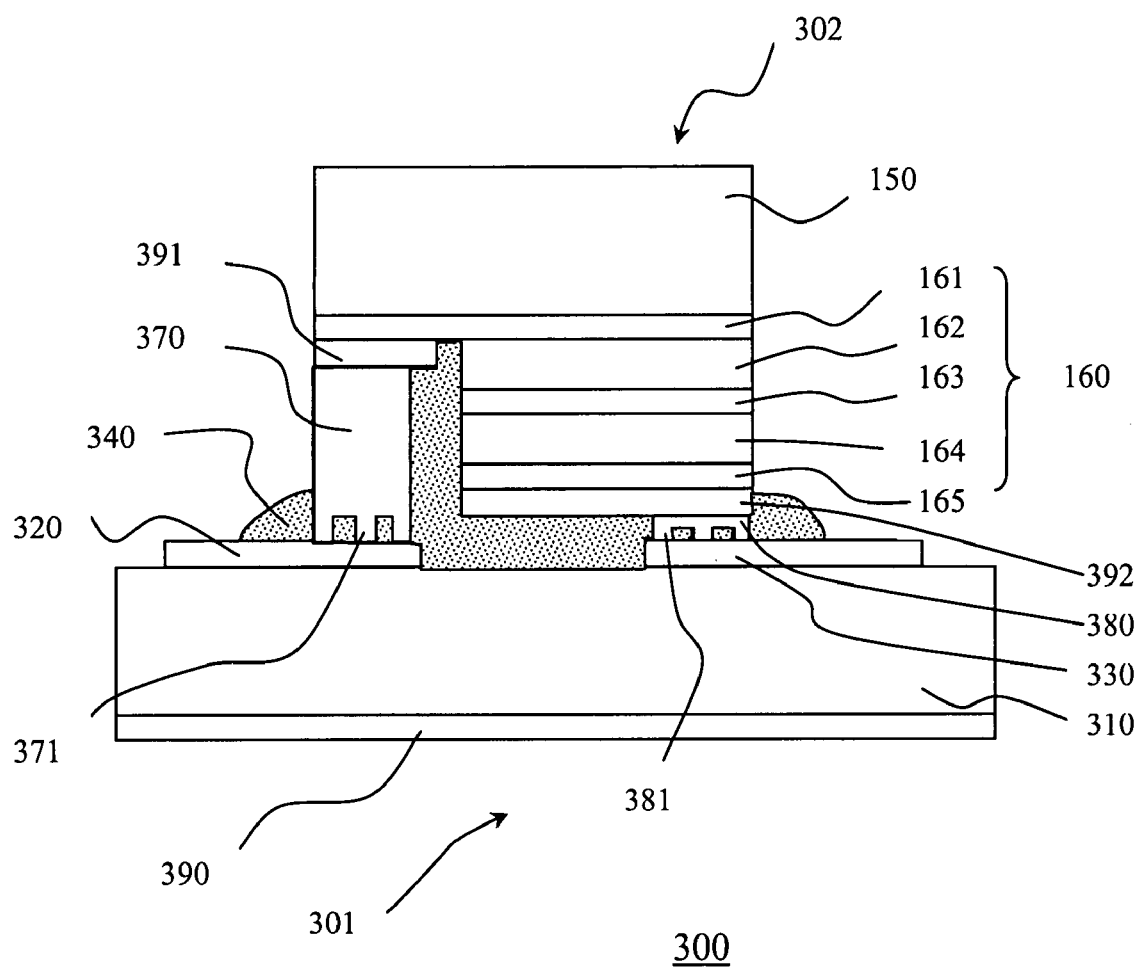
FIG. 3 shows a schematic diagram of the other embodiment of the light-emitting device in the present invention.

In FIG. 3, a loading device 301 of a light-emitting device 300 comprises a light-pervious carrier 310, a first contact pad 320, a second contact pad 330, and an insulated transparent adhesive layer 340. The first contact pad 320 and the second contact pad 330 are respectively located on the upper side of the light-pervious carrier 310. The insulated transparent adhesive layer 340 is located on the upper side of the light-pervious carrier 310, the first contact pad 320, and the second contact pad 330. The material of the light-pervious carrier 310 comprises but is unrestricted to glass, sapphire, SiC, GaP, GaAsP, or ZnSe. The material of the insulated transparent adhesive layer 340 comprises but is unrestricted to spin-on glass, silicon, BCB, epoxy, polyimide, or PFCB. The first contact pad 320 and the second contact pad 330 are electrically insulated between each other. The materials of the first contact pad 320 and the second contact pad 330 comprise conductive metal materials, such as Ni, Au, Al, Pt, Cr, or Ti.

A chip 302 of the light-emitting device 300 is similar to the chip 102 of the light-emitting device 100 in structures. The chip 302 comprises the light-pervious layer 150, the multi-layer epitaxial light-emitting structure 160, a first transparent conductive layer 391, a second transparent conductive layer 392, a third contact pad 370, and a fourth contact pad 380. The multi-layer epitaxial light-emitting structure 160 is located on one side of the light-pervious layer 150. The multi-layer epitaxial light-emitting structure comprises a first contact layer 161, a first cladding layer 162, an active layer 163, a second cladding layer 164, and a second contact layer 165. After the first cladding layer 162, the active layer 163, a second cladding layer 164, and a second contact layer 165 are partially etched, a portion of the first contact layer 161 exposes. In the chip 302, the first transparent conductive layer 391 is attached to the exposed surface of the first contact layer 161, and the third contact pad 370 is attached to the surface of the first transparent conductive layer 391. The second transparent conductive layer 392 is attached to the surface of the second contact layer 165, and the fourth contact pad 380 is attached to the surface of the second transparent conductive layer 392. The surface of the third contact pad 370 has a first plurality of protrusions 371, and the surface of the fourth contact pad 380 has a second plurality of protrusions 381. The material of the first transparent conductive layer 391 comprises but is unrestricted to indium-tin oxide, cadmium-tin oxide, zinc oxide, or zinc-tin oxide. The material of the second transparent conductive layer 392 comprises but is unrestricted to indium-tin oxide, cadmium-tin oxide, zinc oxide, or zinc-tin oxide. The materials of the third contact pad 370 and the fourth contact pad 380 comprise but are unrestricted to Au, Al, Pt, Cr, or Ti.

The chip 302 is mounted reversely on the loading device 301. The insulated transparent adhesive layer 340 adheres the chip 302 to the loading device 301. The first plurality of protrusions 371 pierces the insulated transparent adhesive layer 340 to electrically connect the first contact pad 320. The second plurality of protrusions 381 pierces the insulated transparent adhesive layer 340 to electrically connect the second contact pad 330 as well. The light emitting form the active layer 163 to the loading device 301 passes the insulated transparent adhesive layer 340 and enters the light-pervious carrier 310. Because the light-pervious carrier 310 is transparent, the light can be extracted through the light-pervious carrier. Furthermore, the light-emitting device 300 can additionally have a reflecting body 390 on the bottom surface of the light-pervious carrier 310 if needed. FIG. 3 shows that the reflecting body 390 is attached directly to the bottom surface of the light-pervious carrier 310. The material of the reflecting body 390 comprises Sn, Al, Au, Pt, An, Ge, or Ag. The reflecting body 390 can also be a Distributed Bragg Reflector (DBR) composed of oxide, which is $Al_2O_3$, $SiO_2$, or $TiO_2$.

In the light-emitting device 300, the surfaces of the third contact pad 370 and the fourth contact pad 380 are flat, and the surfaces of the first contact pad 320 and the second contact pad 330 are rough surfaces.

What is claimed is:

1. A light-emitting device comprises:
a carrier, comprising a first contact pad and a second contact pad formed on a top surface;
an insulated transparent adhesive layer, located on the carrier, the first contact pad, and the second contact pad;
a multi-layer epitaxial light-emitting structure, located on the insulated transparent adhesive layer, and comprising a third contact pad and a fourth contact pad on a bottom surface of the multi-layer epitaxial light-emitting structure, wherein at least one of surfaces of the first contact pad and the third contact pad facing the insulated transparent adhesive layer having a first plurality of protrusions, which pierces the insulated transparent adhesive layer to electrically connect the first contact pad to the third contact pad, and at least one of surfaces of the second contact pad and the fourth contact pad facing the insulated transparent adhesive layer having a second plurality of protrusions, which pierces the insulated transparent adhesive layer to electrically connect the second contact pad to the fourth contact pad; and
a light-pervious layer, located on the multi-layer epitaxial light-emitting structure.

2. The light-emitting device according to claim 1 further comprising a reflecting body, located on the bottom surface of the multi-layer epitaxial light-emitting structure uncovered by the third contact pad and the fourth contact pad.

3. The light-emitting device according to claim 1, wherein at least one of the first contact pad, the second contact pad, the third contact pad, and the fourth contact pad is selected from the group consisting of Ni, Au, Al, Pt, Cr, and Ti.

4. The light-emitting device according to claim 1 further comprising a first transparent conductive layer formed between the third contact pad and the multi-layer epitaxial light-emitting structure.

5. The light-emitting device according to claim 4, wherein the first transparent conductive layer is selected from the group consisting of indium-tin oxide, cadmium-tin oxide, zinc oxide, zinc-tin oxide, and film metal.

6. The light-emitting device according to claim 1 further comprising a second transparent conductive layer formed between the fourth contact pad and the multi-layer epitaxial light-emitting structure.

7. The light-emitting device according to claim 6, wherein the second transparent conductive layer is selected from the group consisting of indium-tin oxide, cadmium-tin oxide, Zinc oxide, Zinc-tin oxide, and film metal.

8. The light-emitting device according to claim 1, wherein the insulated transparent adhesive layer is selected from the group consisting of spin-on glass, silicon, BCB, epoxy, polyimide, and PFCB.

9. The light-emitting device according to claim 1, wherein the carrier comprises a first lateral face and a second lateral face located between the top surface and the bottom surface of the carrier and connecting them, and the first contact pad extends to the bottom surface of the carrier along the first lateral face and the second contact pad extends to the bottom surface of the carrier along the second lateral face.

10. A light-emitting device comprises:
a light-pervious carrier, comprising a first contact pad and a second contact pad formed on a top surface;
an insulated transparent adhesive layer, located on the light-pervious carrier, the first contact pad, and the second contact pad;
a multi-layer epitaxial light-emitting structure, located on the insulated transparent adhesive layer, and comprising a third contact pad and a fourth contact pad formed on a bottom surface of the multi-layer epitaxial light-emitting structure, wherein at least one of surfaces of the first contact pad and the third contact pad facing the insulated transparent adhesive layer having a first plurality of protrusions, which pierces the insulated transparent adhesive layer to electrically connect the first contact pad to the third contact pad, and at least one of surfaces of the second contact pad and the fourth contact pad facing the insulated transparent adhesive layer having a second plurality of protrusions, which pierces the insulated transparent adhesive layer to electrically connect the second contact pad to the fourth contact pad; and a light-pervious layer, located on multi-layer epitaxial light-emitting structure.

11. The light-emitting device according to claim 10, wherein at least one of the first contact pad, the second contact pad, the third contact pad, and the fourth contact pad is selected from the group consisting of Ni, Au, Al, Pt, Cr, and Ti.

12. The light-emitting device according to claim 10 further comprising a first transparent conductive layer formed between the third contact pad and the bottom surface of the multi-layer epitaxial light-emitting structure.

13. The light-emitting device according to claim 12, wherein the first transparent conductive layer is selected from the group consisting of indium-tin oxide, cadmium-tin oxide, zinc oxide, zinc-tin oxide, and film metal.

14. The light-emitting device according to claim 10 further comprising a first transparent conductive layer formed between the fourth contact pad and the bottom surface of the multi-layer epitaxial light-emitting structure.

15. The light-emitting device according to claim 14, wherein the second transparent conductive layer is selected from the group consisting of indium-tin oxide, cadmium-tin oxide, Zinc oxide, Zinc-tin oxide, and film metal.

16. The light-emitting device according to claim 10 further comprising a reflecting body attached to the bottom surface of the light-pervious carrier.

17. The light-emitting device according to claim 10, wherein the insulated transparent adhesive layer is selected from the group consisting of spin-on glass, silicon, BCB, epoxy, polyimide, and PFCB.

* * * * *